United States Patent [19]
Konuma et al.

[11] Patent Number: 5,503,731
[45] Date of Patent: Apr. 2, 1996

[54] METHOD FOR PRODUCING ELECTRODES OF SEMICONDUCTOR DEVICE

[75] Inventors: Toshimitsu Konuma; Jun Koyama; Masaaki Hiroki, all of Kanagawa; Shunpei Yamazaki, Tokyo, all of Japan

[73] Assignee: Semiconductor Energy Laboratory Co., Ltd., Kanagawa, Japan

[21] Appl. No.: 362,405

[22] Filed: Dec. 23, 1994

[30] Foreign Application Priority Data

Dec. 27, 1993 [JP] Japan .................................. 5-354094

[51] Int. Cl.$^6$ .................................................. C25D 5/02
[52] U.S. Cl. ........................... 205/98; 205/99; 205/123; 205/124; 205/157; 205/333
[58] Field of Search ........................ 205/124, 123, 205/333, 98, 99, 157

[56] References Cited

U.S. PATENT DOCUMENTS

5,270,229  12/1993  Ishihara ..................................... 437/40
5,359,206  10/1994  Yamamoto ................................ 257/59

Primary Examiner—John Niebling
Assistant Examiner—Brendan Mee
Attorney, Agent, or Firm—Sixbey, Friedman, Leedom & Ferguson; Gerald J. Ferguson, Jr.; Jeffrey L. Costellia

[57] ABSTRACT

A first pair electrodes consisting of an anode to which a plurality of wiring lines to be anodized are connected and a cathode that is opposed to the anode, and a second pair electrodes for collecting impurities in a forming solution are immersed in a forming solution. A voltage is applied to the plurality of wiring lines in such a manner that at least one of the plurality of wiring lines receives the voltage for a different period than the other wiring lines.

20 Claims, 6 Drawing Sheets

METHOD FOR PRODUCING ELECTRODES OF SEMICONDUCTOR DEVICE

BACKGROUND OF THE INVENTION

The present invention relates to a method for producing electrodes in which a porous anodic oxide is deposited by anodic oxidation on surfaces of a plurality of finely patterned metal wiring lines of such devices as semiconductor devices and active liquid crystal electro-optical devices in such a manner that the thickness of an anodic oxide film formed on at least one wiring line is different from the thicknesses of anodic oxide films formed on the other wiring lines.

Conventionally, the following method is employed to form porous anodic oxide films on respective fine wiring lines of several microns to several tens of microns in width and several microns to several hundred of microns in interval with the degree of oxidation varied for the respective wiring lines. The following example is directed to a case where anodic oxide films are formed on two wiring lines at different thicknesses.

Figure 2:
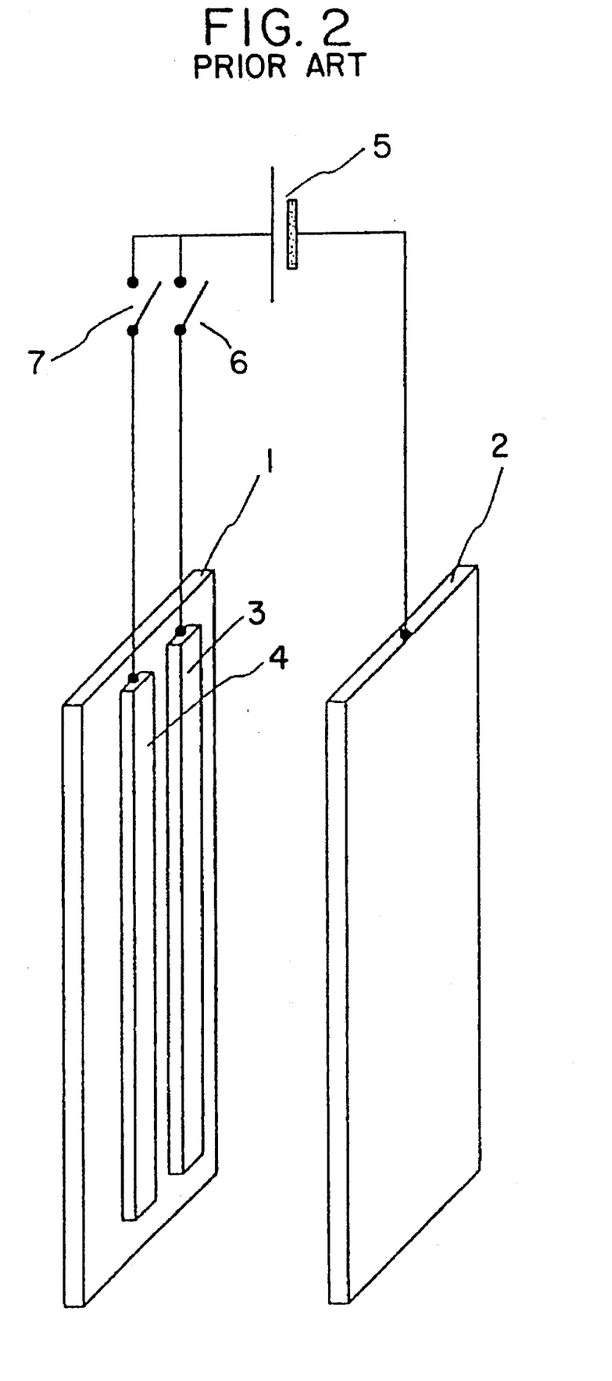
FIG. 2 is a schematic diagram showing a configuration used in a conventional method.

As schematically shown in FIG. 2, a first wiring line 3 and a second wiring line 4 that are made of aluminum and provided on an insulative base 1 and a cathode electrode 2 are immersed in a forming solution (electrolytic solution for anodic oxidation; not shown) that is contained in a vessel. The forming solution may be a 3% aqueous solution of an oxalic acid, an aqueous solution of a sulfuric acid, etc.

A power supply 5 is so provided that a positive potential is applied to the first wiring line 3 and the second wiring line 4 and a negative potential to the cathode electrode 2. The first wiring line 3 and the second wiring line 4 are connected to the power supply 5 via respective switches 6 and 7, which independently perform on/off-control of currents.

The base 1 and the cathode 2 are spaced from each other by 15 to 50 mm. When anodic oxidation is performed, the switches 6 and 7 are turned on to supply 5 to 30 V, in which case the electric field strength is 0.1 to 2 V/mm.

The thickness of an oxide film deposited is proportional to the forming period (voltage application period). Therefore, for example, to make an anodic oxide film deposited on the second wiring line 4 two times thicker than that deposited on the first wiring line 3, the switches 6 and 7 are so controlled that a constant voltage is applied to the first wiring line 3 for 30 minutes and the second wiring line 4 for 60 minutes.

Similarly, in the case of three or more wiring lines, they may be provided with oxide films of two or more, or three or more different thicknesses only by changing the voltage application period.

However, in the above method, it is sometimes the case that the insulation between wiring lines, which is secured before and after anodic oxidation, becomes worse during the anodic oxidation, to cause current leakage. In this case, a current continues to flow through a wiring line even after an associated switch has been turned off to form a thinner oxide film thereon. As a result, this wiring line is provided with an oxide film whose thickness is almost the same as the thickness of other wiring lines.

The above current leakage is considered to occur in the following manner. Impurities, such as dust, minute conductive substances and ionized substances, included in a forming solution are attracted by an electric field developing between the anode and cathode that are given a voltage from the power supply 5, and possibly attached to those electrodes. The impurities produce an electrically conductive state between the wiring lines 3 and 4 that are arranged at a very small interval, i.e., and worsen the insulation between the wiring lines 3 and 4.

SUMMARY OF THE INVENTION

Therefore, an object of the present invention is to prevent such impurities from approaching a pair of electrodes for anodic oxidation.

To attain the above object, according to the invention, a method for producing electrodes of a semiconductor device comprises the steps of:

preparing, in a forming solution, a first pair electrodes consisting of an anode to which a plurality of wiring lines to be anodized are connected and a cathode that is opposed to the anode, and a second pair electrodes for collecting impurities in the forming solution; and applying a voltage to the plurality of wiring lines in such a manner that at least one of the plurality of wiring lines receives the voltage for a different period than the other wiring lines.

According to another aspect of the invention, a method for producing electrodes of a semiconductor device comprises the steps of:

preparing, in a forming solution, a first pair electrodes consisting of an anode to which a plurality of wiring lines to be anodized are connected and a cathode that is opposed to the anode, and a second pair electrodes for collecting impurities in the forming solution; and applying a first voltage between the first pair electrodes and a second voltage between the second pair electrodes so that an electric field developing between the second pair electrodes is stronger than that developing between the first pair electrodes, and in such a manner that at least one of the plurality of wiring lines receives the first voltage for a different period than the other wiring lines.

In the above method, the second pair electrodes may be juxtaposed on a single base.

According to a further aspect of the invention, a method for producing electrodes of a semiconductor device comprises the steps of:

preparing, in a forming solution, a first pair electrodes consisting of an anode to which a plurality of wiring lines to be anodized are connected and a cathode that is opposed to the anode, and a second pair electrodes for collecting impurities in the forming solution; and applying a voltage to the plurality of wiring lines in such a manner that at least one of the plurality of wiring lines receives the voltage for a different period than the other wiring lines, and that the voltage is intermittently made zero or negative.

That is, according to a first important feature of the invention, in forming oxide films of different thicknesses by a single anodic oxidation step by making a voltage application period of at least one of a plurality of wiring lines (which are to become electrodes of a semiconductor device) connected to an anode different from that of the other wiring lines, a second pair electrodes for collecting and trapping impurities in a forming solution which may worsen insulation between the wiring lines is provided separately from a first pair electrodes for effecting the anodic oxidation.

Figure 1:
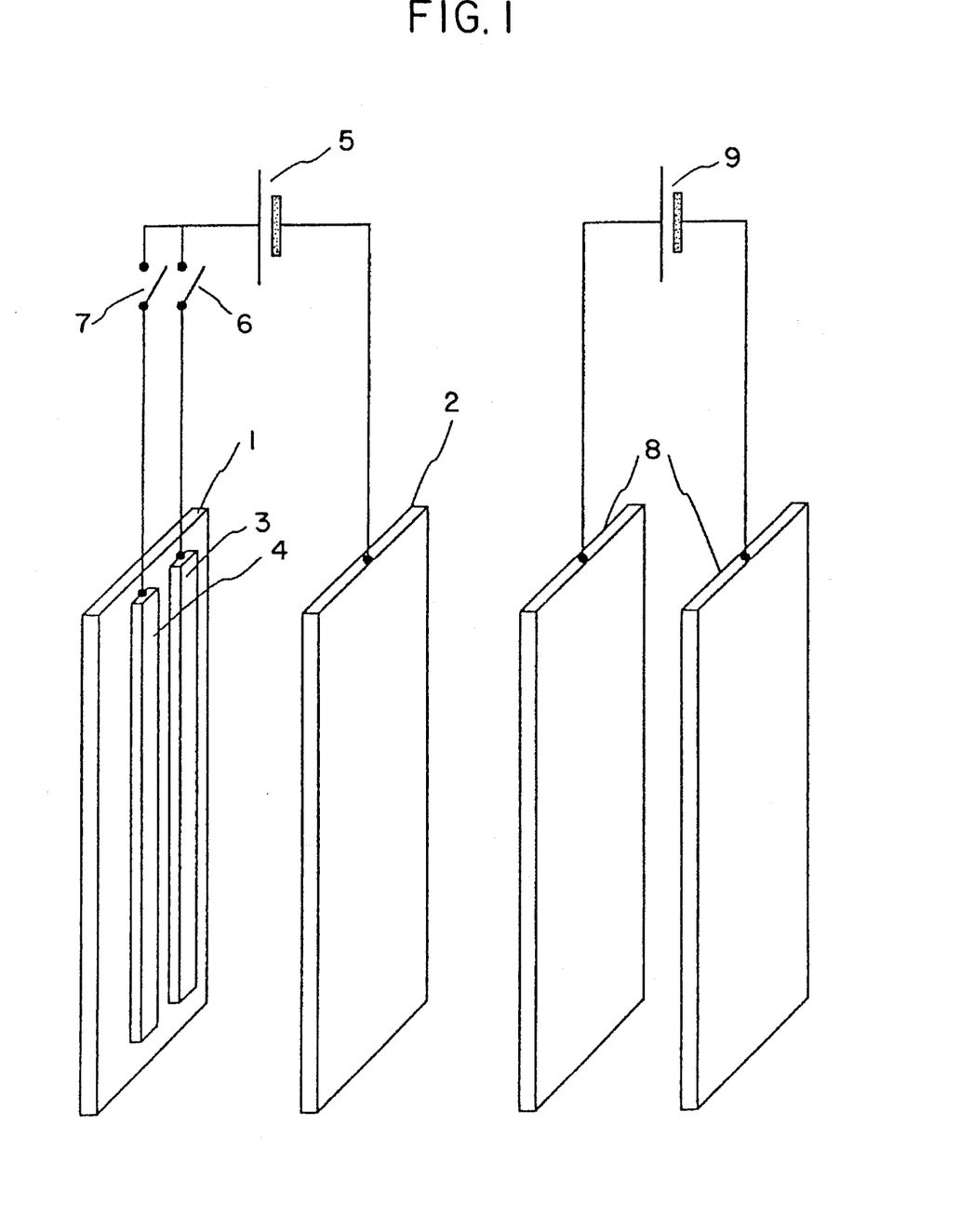
FIG. 1 is a schematic diagram showing a configuration used in a method according to the present invention.

FIG. 1 schematically shows a configuration used in the invention. As in the case of FIG. 2, to simplify the description, this configuration is to anodize two wiring lines.

In FIG. 1, a first pair electrodes for effecting anodic oxidation, which are shown on the left-hand side, have the same configuration as that shown in FIG. 2. That is, the first pair electrodes consisting of a first wiring line 3 and a second wiring line 4 that are provided as anode electrodes on an insulative base 1 and a cathode electrode 2 are immersed in a forming solution (not shown). A power supply 5 and switches 6 and 7 are provided also in the same manner as in the configuration of FIG. 2.

In FIG. 1, a second pair electrodes 8 and a power supply 9 are provided on the right-hand side to collect and trap impurities included in the forming solution. The second pair electrodes are provided at such a position that the second pair electrodes can efficiently trap impurities and do not influence the anodic oxidation by the first pair electrodes. It is effective to provide a plurality of second pairs of electrodes.

The second pair electrodes can trap impurities more efficiently if an electric field between the second pair electrodes is set stronger, preferably 2 to 100 times stronger, than that between the first pair electrodes.

For example, where the distance between the anode and cathode of the first pair electrodes for anodic oxidation is 15 to 50 mm and the application voltage thereto is 5 to 30 V, in which case the electric field strength is 0.1 to 2 V/mm, the distance of the second pair electrodes and the application voltage thereto may be properly set so as to produce an electric field strength of 0.2 to 200 V/mm.

Figure 3:
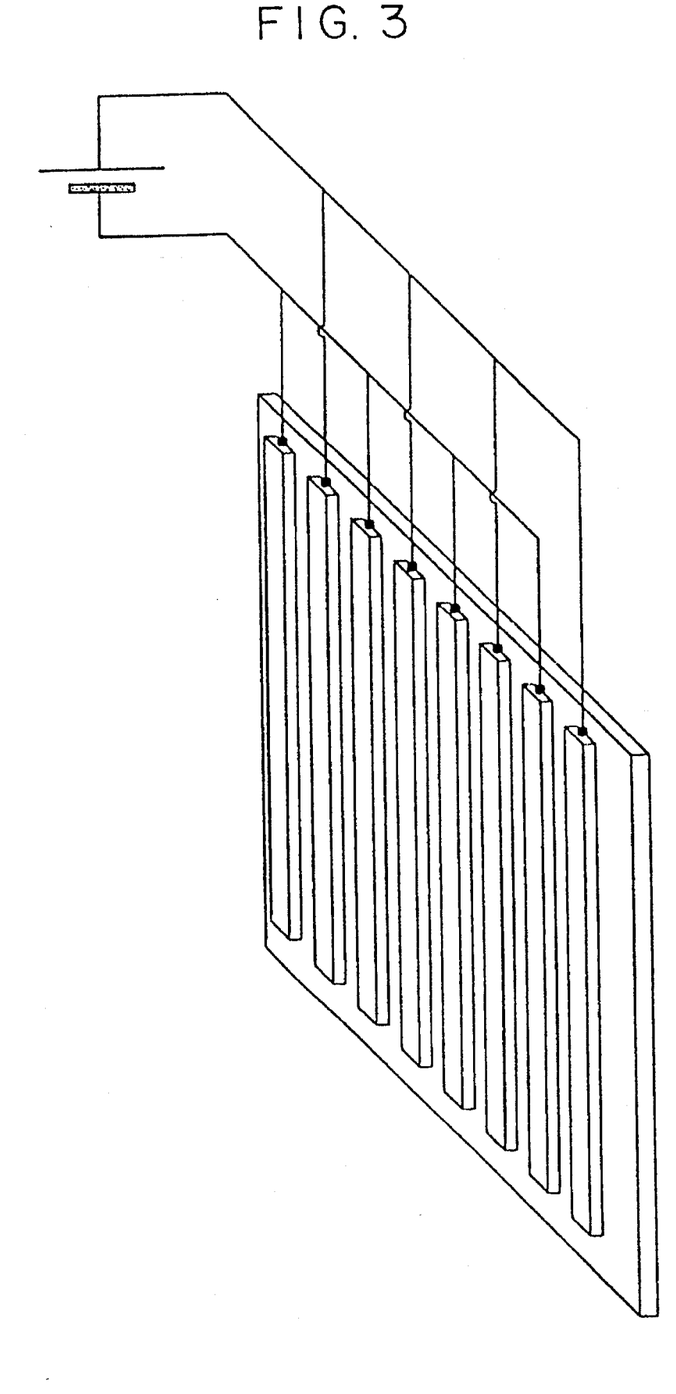
FIG. 3 shows another configuration of second pair electrodes.

As shown in FIG. 3, an electrode pattern of one or more second pairs of electrodes may be provided on a single insulative base. Further, a plurality of such electrode structures may be provided.

According to a second important feature of the invention, in forming oxide films of different thicknesses by a single anodic oxidation step by making a voltage application period of at least one of a plurality of wiring lines connected to an anode different from that of the other wiring lines, a pair of electrodes, which is supplied with a constant DC voltage for anodic oxidation, is intermittently given a zero voltage, or an anode is intermittently supplied with a negative voltage.

According to the first important feature of the invention, in which the second pair electrodes are provided and a voltage is applied to those electrodes, an electric field developing between the second pair electrodes attract impurities in the forming solution to the second pair electrodes side, to thereby reduce impurities that approach the first pair electrodes for anodic oxidation.

In particular, by making the electric field between the second pair electrodes 2 to 100 times stronger than that between the first pair electrodes, impurities in the forming solution can be collected or trapped more efficiently by or around the second pair electrodes.

An electrode pattern of one or more second pairs of electrodes may be provided on a single insulative base such as a substrate. By employing a fine pattern, it becomes easier to increase the electric field strength.

With regard to the second important feature of the invention, when a constant DC voltage is applied to the pair of electrodes for anodic oxidation, impurities are gradually collected between the electrodes to thereby worsen insulation between the first and second wiring lines. It has been found experimentally that in such a case, the insulation between the first and second wiring lines can be restored by temporarily applying a zero voltage to the pair of electrodes or a negative voltage to the anode, and then applying the original constant DC voltage.

This is considered to be due to the following phenomenon. The DC voltage application causes accumulation of impurities between the pair of electrodes for anodic oxidation. By applying a zero voltage or applying a negative voltage to the anode, impurities no longer approach the pair of electrodes or are detached from those electrodes, and are forced to move away from those electrodes by a flow in the solution.

Therefore, the anodic oxidation can be performed with good insulation kept between the first and second wiring lines by intermittently applying a zero voltage to the pair of electrodes or a negative voltage to the anode while the anodic oxidation is performed with the pair of electrodes for the anodic oxidation supplied with a usual DC voltage.

As described above, the invention prevents approach, attachment and the like of impurities to the pair of electrodes for anodic oxidation, to thereby allow the anodic oxidation to be performed while keeping good insulation between a plurality of wiring lines that are arranged very close to each other.

Therefore, there can be prevented leakage of current between a wiring line that is supplied with a voltage and a wiring line that is not supplied with a voltage, which leakage is a problem when the voltage application period is changed for respective wiring lines to oxidize the respective wiring lines at difference degrees in anodic oxidation of a plurality of fine wiring lines.

As a result, it becomes possible to form anodic oxide films of different thicknesses on a plurality of wiring lines while positively controlling the degree of oxidation of each wiring line.

It goes without saying that it is effective to perform anodic oxidation by combining the first and second important features of the invention.

DESCRIPTION OF THE PREFERRED EMBODIMENTS

The following embodiment is directed to a case where in forming a semiconductor integrated circuit having a plurality of thin-film transistors on the same substrate, anodic oxide films of different thicknesses are formed on respective gate electrodes to change the width of a high-resistivity region between the gate electrode and the source and drain regions of each thin-film transistor in accordance with its use.

INTRODUCTION

An insulated-gate semiconductor device (MISFET or an insulated gate field effect transistor) is formed on an insulative substrate or a surface (insulative surface) that is spaced from a semiconductor substrate by a thick insulating film. In particular, a semiconductor device whose semiconductor layer (active layer) is a thin film is called a thin-film transistor (TFT). Usually, such semiconductor devices use a non-single-crystal semiconductor, which is crystalline but not a single crystal. Compared to single crystal semiconductors, non-single-crystal semiconductors have poor characteristics. In particular, when a reverse voltage (a negative voltage in an N-channel TFT, and a positive voltage in a P-channel TFT) is applied to a gate electrode, a source/drain leak current increases. Such a TFT has another problem (deterioration problem) that the mobility decreases with voltage application. It is known that to solve these problems, it is necessary to provide an intrinsic or weak N-type or P-type high-resistivity region between the gate electrode and the source and drain regions.

To form such a high-resistivity region, at least side faces of a gate electrode are oxidized by anodic oxidation or some other method, and doping is performed in a self-aligned manner using the thus-formed oxide film or its trace. Thus, a high-resistivity region of a uniform width can be formed.

However, since such a high-resistivity region also serves as a resistor provided in series between the source and drain, it is rather an obstacle when, for instance, a high-speed operation is needed. This is particularly problematic in forming, on the same insulative surface, TFTs which are required to have different characteristics. For example, in the case of a monolithic circuit having, on the same substrate, an active matrix circuit for driving an electro-optical device and a driver circuit for driving the active matrix circuit, a TFT having a wide high-resistivity region is desired in the active matrix circuit because a leak current should be small.

On the other hand, to enable a high-speed operation, a narrow high-resistivity region is desired in a decoder circuit and a driver circuit, and further in a CPU, a memory circuit, etc. However, all of TFTs formed on the same substrate by the same process have high-resistivity regions of the same width; that is, it is difficult to change the width of a high-resistivity region in accordance with a kind of circuit or its use. This makes it difficult to produce a monolithic, active matrix circuit and its developed version, i.e., a monolithic integrated circuit. The present embodiment shows a method for producing a semiconductor integrated circuit in which the width of a high-resistivity region is changed in accordance with the characteristics and reliability required for a TFT or a circuit, which method has been realized by the invention by solving the above problem.

In the embodiment described below, the width of a high-resistivity region is changed by changing the anodic oxidation period in accordance with a TFT in an anodic oxidation process of a gate electrode.

Further, in a monolithic, active matrix circuit, a high-resistivity region of a TFT in an active matrix circuit for a small off-current, low-frequency operation is made wider than that of a TFT in a driver circuit for a large-current drive, high-frequency operation and a TFT in a decoder circuit for a low power consumption, high-frequency operation.

For example, in a monolithic, active matrix circuit, the width of a high-resistivity region of a TFT in an active matrix circuit is made 0.4 to 1 µm, and that in a driver circuit is 0.2 to 0.3 µm for an N-channel TFT (hereinafter referred to as NTFT) and 0 to 0.2 µm for a P-channel TFT (hereinafter referred to as PTFT). Further, in a decoder used in a CPU and other arithmetic and logic elements/circuits, the thickness of a high-resistivity region ms made 0.3 to 0.4 µm for an N-channel TFT and 0 to 0.2 µm for a P-channel TFT.

In this manner, in the embodiment described below, a high-resistivity region of a TFT in an active matrix circuit is wider than that of a TFT in a driver and a decoder. In the embodiment, a high-resistivity region of an N-channel TFT is wider than that of a P-channel TFT (the method of the invention is not applied).

As described above, a high-resistivity region of a TFT in an active matrix circuit is required to be wider than that of a TFT in a driver and a decoder because the TFT is required to have a small leak current in the former circuit and is required to operate at high speed in the latter circuits. On the other hand, in the same driver or decoder, the width of a high-resistivity region in an N-channel TFT should be different from that in a P-channel TFT for the following reasons.

Particularly in an N-channel TFT, a weak N-type high-resistivity region reduces an electric field in the vicinity of a drain, to thereby suppress deteriorations due to the hot carrier effect. Therefore, a high-resistivity region in an N-type TFT is desired to be of weak N type. On the other hand, such a high-resistivity region need not be provided in a P-channel TFT because of a low degree of deteriorations due to the hot carrier effect. Rather, the existence of a high-resistivity region lowers the operation speed of a TFT. Since the mobility of a P-channel TFT is smaller than that of an N-channel TFT, it is preferred that a high-resistivity region be as narrow as possible. Thus, as described above, a high-resistivity region of an N-channel TFT is made wider than that of a P-channel TFT.

Preliminary steps

FIGS. 4(A) and 4(B) and 5(A)–5(E) show production steps of the embodiment. This embodiment is directed to a monolithic, active matrix liquid crystal display, and the left-hand side of the figures shows complementary TFTs of a driver circuit and the right-hand side shows a pixel control TFT of an active matrix circuit. First, a 2,000-Å-thick silicon dioxide film as an undercoat oxide film 302 was formed on a substrate (Corning 7059, 300 mm×400 mm) 301. A film formed by decomposition and deposition by sputtering or plasma CVD in an oxygen atmosphere is suitable for this oxide film.

Figure 4A:
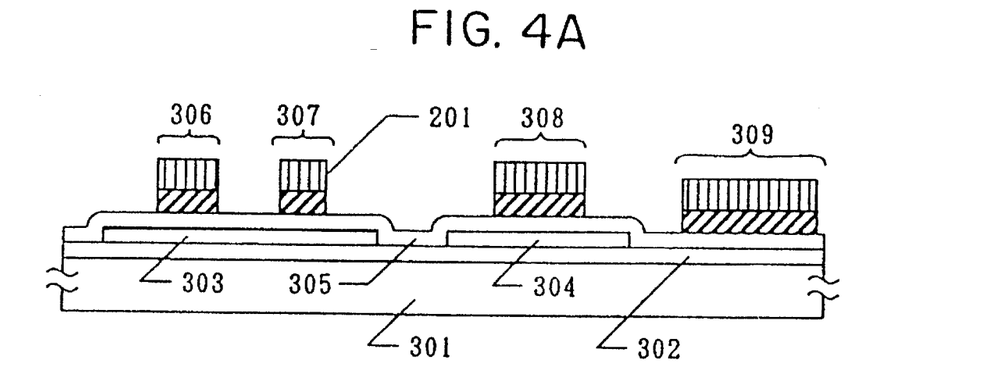
FIGS. 4(A) and 4(B) show production steps of a semiconductor device in an embodiment.
Figure 4B:
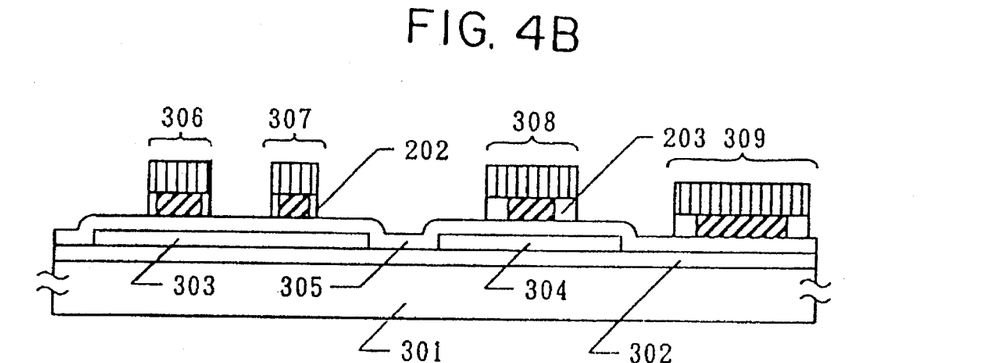

Then, an amorphous silicon film of 300 to 5,000 Å, preferably 500 to 1,000 Å, in thickness was formed by plasma CVD or LPCVD, and crystallized by being left for 24 hours in a reducing atmosphere at 550° C. to 600° C. The silicon film thus crystallized was patterned into island-like active layers 303 and 304. Further, a silicon dioxide film 305 of 700 to 1,500 Å in thickness was formed on the above structure by sputtering.

Then, an aluminum film (containing Sc of 0.1 to 0.3 wt %) of 1,000 Å to 3 µm, for example, 6,000 Å, in thickness was formed by sputtering. A photoresist (for example, OFPR 800/30 cp manufactured by Tokyo Ohka Kogyo Co., Ltd.) was formed on the aluminum film by spin coating.

Before forming the photoresist, a barrier-type aluminum oxide film (not shown) of 100 to 1,000 Å in thickness was formed on the aluminum surface by anodic oxidation in a neutral solution. More specifically, anodic oxidation was performed using a solution obtained by diluting a 3% aqueous solution of ammonium tartrate with ethylene glycol at a ratio of 1:9 with a constant current of 0.05 to 0.2 mA/cm$^2$ until a voltage of 10 to 50 V is reached. The voltage increasing speed was 1 to 4 V/min, which means forming of 2 to 50 minutes. Subsequently, the anodic oxidation was continued for 30 minutes at the voltage thus reached. It is preferred that a voltage used in anodic oxidation for forming a porous film according to the invention (described later) be lower than the above voltage.

Formation of the aluminum oxide film improved adhesiveness of the photoresist. Further, suppressing leakage of current from the photoresist, the aluminum oxide film is effective in depositing porous anodic oxide on only the side faces in an anodic oxidation step described later.

Then, the photoresist was patterned and etched together with the aluminum film to form gate electrodes 306–308 and a wiring line 309. The photoresist 201 left on those gate electrodes and wiring line serves as a mask for preventing anodic oxidation in the subsequent anodic oxidation step. (See FIG. 4 (A))

The gate electrodes 306–308 are electrically independent of each other, and the gate electrode 308 and the wiring line 309 are electrically connected to each other.

First application of the invention

An anodic oxide film of 3,000 Å to 25 µm in thickness was formed by subjecting the above structure to anodic oxidation with current flowing in an electrolytic solution. The anodic oxidation was performed in such a manner that a 3% to 20% acid aqueous solution of a citric acid, an oxalic acid, phosphoric acid, chromic acid, sulfuric acid, or the like was used and a constant voltage of 5 to 30 V was applied to the gate electrodes. The anodic oxide films thus formed were porous. In this embodiment, anodic oxidation was performed for 20 to 140 minutes in a 3% aqueous solution of an oxalic acid (30° C.) with a voltage of 8 V.

Using the anodic oxidation method of the invention, the thicknesses of anodic oxide films formed were controlled by the anodic oxidation period. Thin anodic oxide films of 500 to 2,000 Å, for instance 1,000 Å, in thickness were formed on the gate electrodes 306 and 307, and thick anode oxide films of 3,000 to 9,000 Å, for instance 5,000 Å, in thickness were formed on the gate electrode 308 and the wiring line 309. Particularly in this embodiment, since the mask is provided on the gate electrodes 306–308 and the wiring line 309, the top surfaces thereof are not anodized and an anodic oxide is formed on only both side faces thereof.

First, the gate electrodes 306 and 307 (first wiring lines) and the gate electrode 308 (second wiring line) and the wiring line 309 connected to the gate electrode 308, all of which are formed on the substrate 301, were connected to a power supply electrically independently of each other, and immersed in the solution so as to be opposed to a platinum or stainless steel cathode electrode plate of the same size as the substrate 301. Thus, first pair electrodes were prepared. The interval between the substrate 301 and the cathode electrode plate is set at 15 to 50 mm. Actually, it was set at 20 mm.

On the other hand, second pair electrodes for trapping impurities in the solution were prepared in such a manner that platinum or stainless steel substrates of 100 mm×100 mm in size and 1 mm in thickness were opposed to each other at an interval of 2 to 20 mm. Actually, the interval was set at 4 mm. The second pair electrodes were disposed on all four sides of the substrate 301 so as to enclose the first pair electrodes. The second pair electrodes may be an electrode pattern formed on an insulative substrate as shown in FIG. 3. For example, the second pair electrodes may be formed by coating a substrate such as a glass substrate with a stainless steel film of 1 to 100 µm in thickness and patterning it.

The application voltage was set at 32 V. If the second pair electrodes are too close to the first pair electrodes, and if there exists a large difference between the application voltages, ununiform anodic oxidation may occur. Therefore, the interval between the first pair electrodes and the second pair electrodes and the voltage between the second pair electrodes should be so set as to cause no electrical influence on the anodic oxidation.

In this embodiment, while the electric field strength between the first pair electrodes is 0.4 V/mm, that between the second pair electrodes is 8 V/mm, which is 20 times larger than the former.

Then, after the voltage was applied to all of the gate electrodes 306–308 for 20 minutes, the current supply to the gate electrodes 306 and 307 was finished but the voltage was continued to be applied to the gate electrode 308 for additional 80 minutes (100 minutes in total). Since the wiring line 309 was electrically connected to the gate electrode 308, it was also supplied with the voltage for 100 minutes. It is effective to form a flow of the solution between the first pair electrodes by agitation or overflow (recycling the solution by supplying it to one side and discharging it from the other side).

In the above manner, 1,000-Å-thick porous anodic oxide films 202 were formed on the side faces of the gate electrodes 306 and 307, and 5,000-Å-thick porous anodic oxide films 203 were formed on the side faces of the gate electrode 308 and the wiring line 309. (See FIG. 4(B))

On the other hand, another anodic oxidation was conducted under the same conditions except that the second pair electrodes were not used. Although no current was supplied to the gate electrodes 306 and 307 after a lapse of the first 20 minutes, a 5,000-Å-thick porous anodic oxide film was formed on the gate electrodes 306 and 307 as well as the gate electrode 308. That is, the degree of anodic oxidation could not be changed.

Second application of the invention

In this anodic oxidation step, the second pair electrodes are not provided, and the voltage between the first pair electrodes is intermittently made zero or a negative voltage is intermittently applied to the anode, i.e., the first and second wiring lines.

First, the gate electrodes 306 and 307 (first wiring lines) and the gate electrode 308 (second wiring line) and the wiring line 309 connected to the gate electrode 308, all of which are formed on the substrate 301, were connected to a power supply electrically independently of each other, and immersed in the solution so as to be opposed to a platinum or stainless steel cathode electrode plate of the same size as the substrate 301. Thus, the first pair electrodes were prepared. The interval between the substrate 301 and the cathode electrode plate is set at 15 to 50 mm. Actually, it was set at 20 mm.

Then, after the voltage was applied to all of the gate electrodes 306–308 for 20 minutes, the current supply to the gate electrodes 306 and 307 was finished but the voltage was continued to be applied to the gate electrode 308 so that the anodic oxidation further proceeds on the gate electrode 308.

In the above operation, 0 V or a negative voltage, for instance, −8 V, was applied to the gate electrode 308 at a rate of 6 seconds per 1 minute (the potential of the cathode was always kept at 0 V). More specifically, 0 V or the negative voltage may be applied for 6 seconds after the normal voltage is applied for 54 seconds. Alternatively, 0 V or the negative voltage may be applied for 1 second after the normal voltage is applied for 9 seconds. It is preferred that the ratio of applying 0 V or the negative voltage to the period of applying the normal voltage be 1:1 (AC voltage) to 1:60. As the ratio becomes closer to 1:1, the time required for the anodic oxidation becomes longer.

The voltage application continued for 88 minutes. Since the wiring line 309 was electrically connected to the gate electrode 308, it was also supplied with the voltage for 88 minutes. It is effective to form a flow of the solution between the first pair electrodes by agitation or overflow (recycling the solution by supplying it to one side and discharging it from the other side).

In the above manner, 1,000-Å-thick porous anodic oxide films 202 were formed on the side faces of the gate electrodes 306 and 307, and 5,000-Å-thick porous anodic oxide films 203 were formed on the side faces of the gate electrode 308 and the wiring line 309. (See FIG. 4(B))

In this method, although the time required for the anodic oxidation is longer, the second pair electrodes are not needed. Therefore, this method has an advantage that it can be practiced more easily. It is apparently effective to provide the second pair electrodes to prevent, more efficiently, impurities from approaching the wiring lines.

On the other hand, another anodic oxidation was conducted under the same conditions except that the intermittent application of 0 V or the negative voltage was not performed. Although no current was supplied to the gate electrodes 306 and 307 after a lapse of the first 20 minutes, a 5,000-Å-thick porous anodic oxide film was formed on the gate electrodes 306 and 307 as well as the gate electrode 308. That is, the degree of anodic oxidation could not be changed.

Remaining steps

Figure 5A:
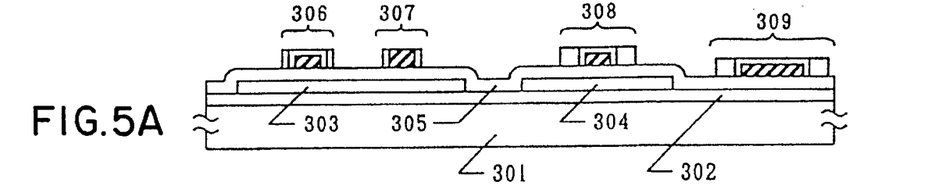
FIGS. 5(A)–5(E) show production steps of the semiconductor device in the embodiment.

Then, the photoresist mask was removed, and barrier type anodic oxide films were formed around the gate electrodes and the wiring line by performing anodic oxidation with voltage application to the gate electrodes in the same manner as the barrier type aluminum oxide was formed in the previous step. The forming solution may be a solution containing a 3% to 10% aqueous solution of a tartaric acid or a boric acid, PH-adjusted to about 7 by addition of ammonia water, and added with an ethylene glycol solution.

The same voltage was applied to all of the gate electrodes and the wiring line other than the gate electrode 307. As a result, a barrier type anodic oxide was formed on the top surface and the side faces of the gate electrodes and the wiring line other than the gate electrode 307. In this embodiment, with application of 100 V, the thickness of the barrier type anodic oxide film is 1,000 to 1,400 Å. It was actually 1,000 Å. (See FIG. 5(A))

The thickness of the barrier type anodic oxide film can be selected arbitrarily. However, if it is too thin, aluminum may be eluted when the porous anodic oxide film is etched later. It was preferable that the thickness of the barrier type anodic oxide film be more than 500 Å. Attention should be given to the fact that although the barrier type anodic oxide film is formed in the later step, it is formed between the porous anodic oxide film and the gate electrode rather than outside the porous anodic oxide film.

Then, the silicon dioxide film 305 was etched by dry etching. This etching may be either a plasma etching mode (isotropic etching) or a reactive ion etching mode (anisotropic etching). However, it is important that the selection ratio of silicon to silicon dioxide be set sufficiently large to prevent excessively deep etching of the active layer. For example, when $CF_4$ was used as an etching gas, the anodic oxide was not etched. As a result, portions of the silicon oxide film 305 which portions lie under the gate electrodes 306–308 and the wiring line 309 were not etched, to remain as gate insulating films 310–312 and an insulating film 313, respectively. (See FIG. 5(B))

Figure 5B:
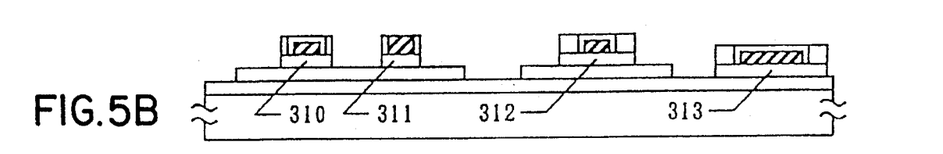
Figure 5C:
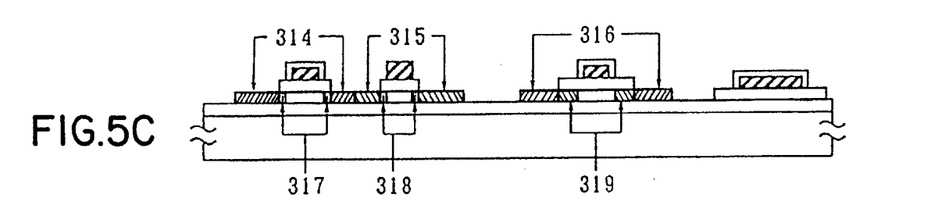

Then, the porous anodic oxide films were etched with a mixed acid of a phosphoric acid, an acetic acid and a nitric acid. Then, by ion doping, impurities were implanted into the active layers 303 and 304 of the TFTs in a self-aligned manner using the gate electrode portions (i.e., the gate electrodes and the anodic oxide films around the gate electrodes) and the gate insulating films as a mask. In this case, various properties of impurity regions are conceivable in terms of combination of an ion acceleration voltage and a dose. For example, if the acceleration voltage is set at a higher value of 50 to 90 kV and the dose is set at a smaller value of $1 \times 10^{13}$ to $5 \times 10^{14}$ cm$^{-2}$, in regions 314–316 most of impurity ions pass through the active layer, to exhibit a maximum density in the undercoat film 302. Therefore, the regions 314–316 become impurity regions of an extremely low density. On the other hand, with regard to regions 317–319 under the gate insulating films 310–312, high-speed ions are decelerated by the gate insulating films 310–312, to exhibit a maximum density in the regions 317–319. Therefore, the regions 317–319 become low-density impurity regions.

Conversely, if the acceleration voltage is set at a lower value of 5 to 30 kV and the dose is set at a larger value of $5 \times 10^{14}$ to $5 \times 10^{15}$ cm$^{-2}$, a large number of impurity ions are implanted into the regions 314–316, which become high-density impurity regions. On the other hand, with regard to the regions 317–319 under the gate insulating films 310–312, low-speed ions are obstructed by the gate insulating films 310–312. Therefore, only a small number of impurity ions are implanted into the regions 317–319, which become low-density impurity regions. In either method, the regions 317–319 become low-density impurity regions. In this embodiment, either method may be employed.

After N-type low-density impurity regions 317 and 319 and a P-type low-density impurity region 318 are formed by ion doping, impurity ions introduced into the active layer were activated by illumination of light emitted from a KrF excimer laser (wavelength: 248 nm; pulse width: 20 nsec). This step may be a RTP (rapid thermal process). (See FIG. 5(C))

Effect obtained by applying the invention to the embodiment

With the above process, the width of the high-resistivity region (i.e., the low-density region and offset region) was changed for each TFT. That is, in the N-channel TFT of the driver circuit, a width $x_1$ of the high-resistivity region is 2,000 Å, i.e., a sum of the offset width 1,000 Å and the low-density region width 1,000 Å. In the P-channel TFT of the driver circuit, a width $x_2$ is 1,000 Å, i.e., the width of only the low-density region. In the pixel control TFT, $x_3$ is 6,000 Å, i.e., a sum of the offset width 1,000 Å and the low-density region width 5,000 Å.

Remaining steps (continued)

Further, a coating of an appropriate metal such as titanium, nickel, molybdenum, tungsten, platinum or palladium, for instance, a titanium film 320 of 50 to 500 Å in thickness was formed over the entire surface by sputtering. As a result, the metal film (titanium film) 320 was formed in close contact with the high-density (or very-low-density) impurity regions 314–316. (See FIG. 5(D))

Figure 5D:
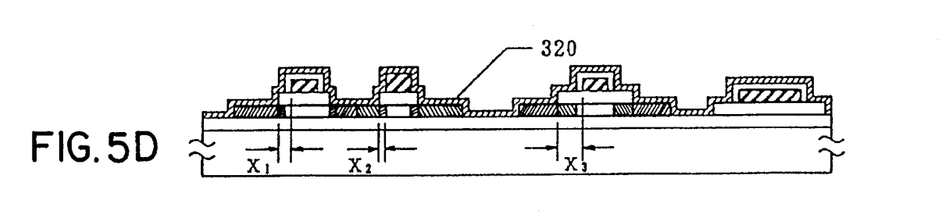

Illuminated with light from a KrF excimer laser (wavelength: 248 nm; pulse width: 20 nsec), the metal film (titanium film) 320 and silicon of the active layers reacted with each other, to produce metal silicide (titanium silicide) regions 330–332. An appropriate range of the energy density of laser light was 200 to 400 mJ/cm$^2$, preferably, 250 to 300 mJ/cm$^2$. During the laser light illumination, peeling of the titanium film was suppressed by heating the substrate to 200°–500° C.

While the excimer laser was used in this embodiment, it goes without saying that other types of lasers may be used.

However, pulsed lasers are preferable, because due to longer illumination time, CW lasers may cause an illuminated material to be expanded by heat, to be thereby peeled off.

Examples of usable pulsed lasers are: infrared lasers such as a Nd:YAG laser (Q-switch pulsed oscillation is desirable), visible light lasers utilizing a second harmonic of infrared laser light, and ultraviolet lasers using excimers such as KrF, XeCl and ArF. Where laser light illumination is performed from above the metal film, it is necessary to select a laser having such an oscillation wavelength that emitted laser light is not reflected by the metal film. But this need not be considered where the metal film is very thin. Laser light may be illuminated from the substrate side. In this case, laser light should be selected which passes through the silicon semiconductor film that lies under the metal film.

Annealing may be lamp annealing of visible light or infrared light illumination. In the lamp annealing, illumination with a lamp is so performed that the temperature of an illuminated surface reaches 600° C. to 1,000° C. In the case of 600° C., the illumination is continued for several minutes. In the case of 1,000° C., the illumination is continued for several tens of minutes. Annealing by near infrared light (for instance, 1.2 μm) is favorable for the following reasons. Since near infrared light is selectively absorbed by the silicon semiconductor, the glass substrate is not heated much. The heating of the glass substrate can further be suppressed by shortening each illumination time.

Then, the non-reacted portions of the titanium film were etched with an etching liquid that was prepared by mixing hydrogen peroxide, ammonia and water at a ratio of 5:2:2. The portions of the titanium film that were not in direct contact with the active layers (for instance, the portions located on the gate insulating films and the anodic oxide films), which remained as metal, were removed by the etching. On the other hand, the metal silicide regions, i.e., the titanium silicide regions 330–332 were not etched and left as they were. In this embodiment, the sheet resistance of the silicide regions 330–332 was 10 to 50 Ω/square. On the other hand, the sheet resistance of the low-density impurity regions 317–319 was 10 to 100 kΩ/square.

Then, a silicon nitride film 322 of 500 to 3,000 Å, for instance 1,000 Å, in thickness was formed on an NTFT 337 in an active matrix circuit. In general, silicon nitride films have a feature of capturing holes. Therefore, the silicon nitride film 322 was effective in preventing charge-up of a gate insulating film by injected hot electrons, particularly when it was used in devices where hot carriers likely occur, for instance, a TFT in an active matrix circuit. Since the silicon nitride film has adverse effects when used in a PTFT, it is preferable that the silicon nitride film not be used in portions including a complementary circuit. For this reason, in this embodiment the silicon nitride film is used only in the active matrix circuit (right-hand side in FIG. 5(E)).

Figure 5E:
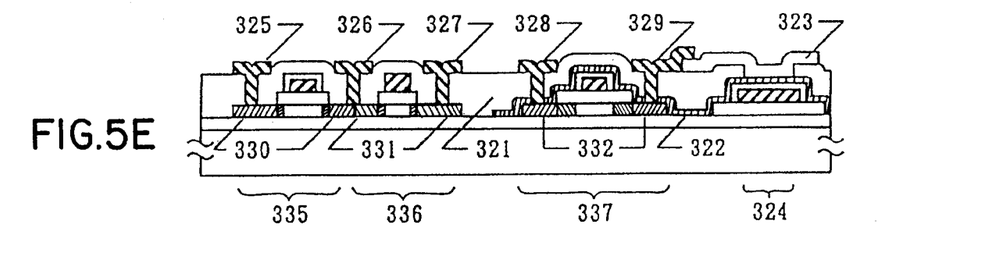

Further, a silicon oxide film of 2,000 Å to 1 μm, for instance 5,000 Å, in thickness was formed by CVD over the entire surface as an interlayer insulating layer 321. Then, a hole 324 was formed in the wiring line 309 to expose the silicon nitride film 322. Then, an ITO film was formed by sputtering, and patterned and etched to form a pixel electrode 323. In the hole 324, the pixel electrode 323 and the wiring line 309 formed a capacitor with the barrier type anodic oxide film (1,000 Å) and the silicon nitride film (1,000 Å) interposed in between. By virtue of the anodic oxide film and the silicon nitride film being thin and having large dielectric constants, a large capacitance was obtained with a small area. This capacitor is used as a holding capacitor that is connected in parallel to a capacitor formed by a pixel of the active matrix and an opposite electrode. That is, the wiring line 309 is kept at the same potential as the opposite electrode.

Then, the interlayer insulating layer 321 was etched to form contact holes for the sources and drains, the gate electrodes, etc. of the TFTs, and wiring lines and electrodes 325–329 were formed by a multi-layer film of titanium nitride and aluminum which film is 2,000 Å to 1 μm, for instance 5,000 Å, in thickness. (See FIG. 5(E))

Summary of the embodiment

In this embodiment, the widths of the high-resistivity regions of the NTFT 337 in the active matrix circuit, the NTFT for high-frequency, lower-power-consumption operation in a decoder, CPU, memory, etc. and the NTFT and PTFT in a driver for high-power driving were made the same as those in the second embodiment. Thus, it has been shown that the width of the high-resistivity region can be optimized in each of the N-channel TFT and the P-channel TFT in the thin-film integrated circuit having the monolithic electro-optical device.

Prospects for the future

Figure 6:
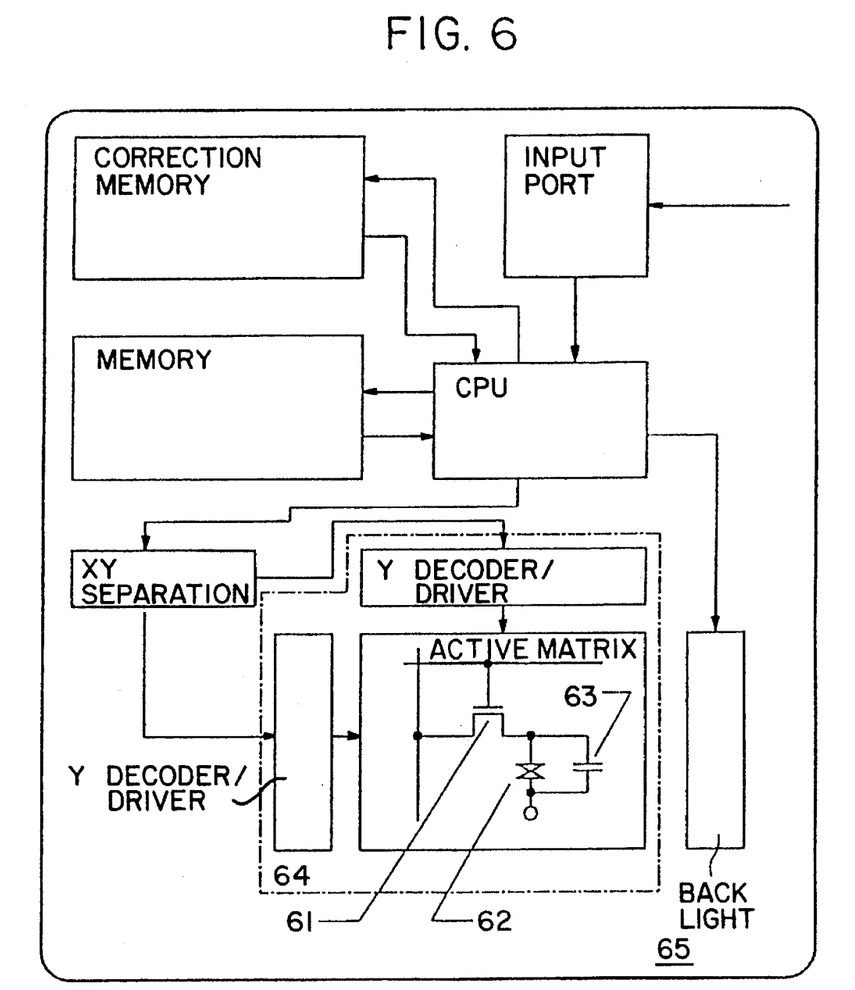
FIG. 6 is a block diagram of a semiconductor integrated circuit according to another embodiment.

FIG. 6 is a block diagram of an electro-optical system using an integrated circuit in which a display, a CPU and a memory are mounted on a single glass substrate. In this embodiment, a part of the electro-optical system including an active matrix circuit, an X decoder/driver and a Y decoder/driver is mainly shown. However, it would be easily understood that a more advanced circuit and system can be formed as a developed version of this embodiment.

An input port reads an externally input signal, and converts it to an image signal. A correction memory is a memory inherent in an active matrix panel, and corrects an input signal etc. in accordance with characteristics of the panel. In particular, the correction memory (nonvolatile memory) stores information specific to respective pixels, and corrects that information individually. More specifically, when pixels of an electro-optical device 64 have a point defect, the correction memory sends to pixels around that point defect respective signals that have been corrected for the point defect, to thereby compensate for the point defect and prevent it from being recognized. Further, when a certain pixel is darker than adjacent pixels, the correction memory sends a larger signal to the dark pixel to obtain the same brightness as the adjacent pixels.

The CPU and the memory are similar to those used in ordinary computers. In particular, the memory has, as a RAM, an image memory that corresponds to the respective pixels. A back light, which illuminates the substrate from the back side, can be adjusted in accordance with the image information.

To obtain high-resistivity regions having widths suitable for the above respective circuits, 3 to 10 groups of wiring lines may be formed in such a manner that the conditions of anodic oxidation can be changed individually. Typical dimensions are as follows. In the active matrix circuit, the width of a high-resistivity region may be set at 0.4 to 1 μm, for instance, 0.6 μm with the channel length set at 10 μm. In an N-channel TFT of the driver circuit, the width of a high-resistivity region may be set at 0.2 to 0.3 μm, for instance, 0.25 μm with the channel length and channel width set at 8 μm and 200 μm, respectively. In a P-channel TFT of the driver circuit, the width of a high-resistivity region may be set at 0 to 0.2 μm, for instance, 0.1 μm with the channel length and channel width set at 5 μm and 500 μm, respectively. In an N-channel TFT of the decoder, the width of a high-resistivity region may be set at 0.3 to 0.4 μm, for instance, 0.35 μm with the channel length and channel width set at 8 μm and 10 μm, respectively. In a P-channel TFT of the decoder, the width of a high-resistivity region may be set at 0 to 0.2 μm, for instance, 0.1 μm with the channel length and channel width set at 5 μm and 10 μm, respectively. Further, in FIG. 6, in an NTFT and a PTFT of the CPU, input port, correction memory and memory, the width of a high-resistivity region may be optimized in the same manner as in the decoder for high-frequency, lower-power-consumption operation. In the above manner, the electro-optical device 64 was formed on the same substrate having an insulating surface.

In this embodiment, by using the method of the invention, two kinds of high-resistivity regions were given different widths in accordance with their usages. Any number of widths can be obtained as long as anodic oxidation can be performed by controlling the voltage application period. The high-resistivity region need not be made of completely the same material nor have the same conductivity type as the channel forming region. More specifically, in an NTFT, N-type impurities may be added slightly. In a PTFT, P-type impurities may be added slightly. Forming a high-resistivity region by selectively adding carbon, oxygen, nitrogen, etc. is effective in eliminating a tradeoff between deteriorations due to hot carriers and the reliability, frequency characteristics and off-current.

The invention prevents approach, attachment, etc. of impurities to the pair of electrodes for anodic oxidation, and enables the anodic oxidation while a high degree of insulation is kept between a plurality of wiring lines that are very close to each other. As a result, it has become possible to prevent leakage of current between a wiring line that is supplied with a voltage and a wiring line that is not supplied with a voltage, which leakage is a problem when the voltage application period is changed for respective wiring lines to oxidize the respective wiring lines at difference degrees in anodic oxidation of a plurality of fine wiring lines. As a result, it has become possible to form anodic oxide films of different thicknesses on a plurality of wiring lines while positively controlling the degree of oxidation of each wiring line.

For example, TFTs each having a high-resistivity region of an optimum width in accordance with characteristics and the degree of reliability required for it can be formed on the same substrate. As a result, it has become possible to obtain a high degree of freedom which could not be obtained conventionally, to thereby realize more highly integrated circuits.

What is claimed is:

1. A method for producing electrodes of a semiconductor device comprising the steps of:
    preparing, in a forming solution, a first pair electrodes consisting of an anode to which a plurality of wiring lines to be anodized are connected and a cathode that is opposed to the anode and a second pair electrodes for collecting an impurity in the forming solution;
    applying a voltage to the plurality of wiring lines in such a manner that at least one of the plurality of wiring lines receives the voltage for a different period than the other wiring lines; and
    applying a voltage to the second pair electrodes sufficient to collect impurities from the solution.

2. The method of claim 1 wherein the forming solution comprises an electrolytic solution.

3. The method of claim 1 wherein the semiconductor device is an electro-optical device.

4. The method of claim 1 wherein the semiconductor device is a monolithic active matrix liquid crystal display.

5. The method of claim 1 wherein the wiring lines comprise gate electrodes of insulated gate field effect transistors.

6. The method of claim 1 wherein the second pair electrodes are juxtaposed on a single base.

7. The method of claim 1 wherein the forming solution is agitated or overflows during the applying step.

8. A method for producing electrodes of a semiconductor device comprising the steps of:
    preparing, in a forming solution, a first pair electrodes consisting of an anode to which a plurality of wiring lines to be anodized are connected and a cathode that is opposed to the anode, and a second pair electrodes for collecting an impurity in the forming solution; and
    applying a first voltage between the first pair electrodes and a second voltage between the second pair electrodes so that an electric field developing between the second pair electrodes is stronger than that developing between the first pair electrodes, and in such a manner that at least one of the plurality of wiring lines receives the first voltage for a different period than the other wiring lines.

9. The method of claim 8 wherein the forming solution comprises an electrolytic solution.

10. The method of claim 8 wherein the semiconductor device is an electro-optical device.

11. The method of claim 8 wherein the semiconductor device is a monolithic active matrix liquid crystal display.

12. The method of claim 8 wherein the wiring lines comprise gate electrodes of insulated gate field effect transistors.

13. The method of claim 8 wherein the electric field developing between the second pair electrodes is 2 to 100 times as strong as that developing between the first pair electrodes.

14. The method of claim 8 wherein the second pair electrodes are juxtaposed on a single base.

15. A method for producing electrodes of a semiconductor device comprising the steps of:
    preparing, in a forming solution, a first pair electrodes consisting of an anode to which a plurality of wiring lines to be anodized are connected and a cathode that is opposed to the anode, and a second pair electrodes for collecting an impurity in the forming solution;
    applying a voltage to the plurality of wiring lines in such a manner that at least one of the plurality of wiring lines receives the voltage for a different period than the other wiring lines, and that the voltage is intermittently made zero or negative; and
    applying a voltage to the second pair electrodes sufficient to collect impurities from the solution.

16. The method of claim 15 wherein the forming solution comprises an electrolytic solution.

17. The method of claim 15 wherein the semiconductor device is an electro-optical device.

18. The method of claim 15 wherein the semiconductor device is a monolithic active matrix liquid crystal display.

19. The method of claim 15 wherein the wiring lines comprise gate electrodes of insulated gate field effect transistors.

20. A method for producing electrodes of a semiconductor device comprising the steps of:

preparing, in a forming solution, a first pair electrodes consisting of an anode to which a plurality of wiring lines to be anodized are connected and a cathode that is opposed to the anode, and a second pair electrodes for collecting an impurity in the forming solution; and applying a first voltage between the first pair electrodes and a second voltage between the second pair electrodes.

* * * * *